(12) United States Patent
Lin et al.

(10) Patent No.: US 8,829,561 B2
(45) Date of Patent: Sep. 9, 2014

(54) METALLIC FRAME STRUCTURE AND LED DEVICE HAVING THE SAME

(75) Inventors: Chen-Hsiu Lin, New Taipei (TW); Yi-Chien Chang, Taipei (TW)

(73) Assignees: Lite-On Electronics (Guangzhou) Limited, Guangzhou (CN); Lite-On Technology Corporation, Taipei (TV)

( * ) Notice: Subject to any disclaimer, the term of this patent is extended or adjusted under 35 U.S.C. 154(b) by 15 days.

(21) Appl. No.: 13/620,556

(22) Filed: Sep. 14, 2012

(65) Prior Publication Data
US 2013/0256733 A1 Oct. 3, 2013

(30) Foreign Application Priority Data

Mar. 30, 2012 (CN) .......................... 2012 1 0088452

(51) Int. Cl.
*H01L 33/62* (2010.01)
(52) U.S. Cl.
USPC 257/99; 257/666; 257/E23.043; 257/E33.066
(58) Field of Classification Search
CPC ................... H01L 23/49548; H01L 23/49451; H01L 33/38; H01L 33/62
USPC ............. 257/99, 666, 676, E23.043, E33.066
See application file for complete search history.

(56) References Cited

U.S. PATENT DOCUMENTS

| 6,576,989 | B1 * | 6/2003 | Hong et al. | 257/678 |
| 7,078,271 | B2 * | 7/2006 | Mahle | 438/123 |
| 7,964,943 | B2 * | 6/2011 | Seo et al. | 257/676 |
| 8,536,688 | B2 * | 9/2013 | Ahn et al. | 257/676 |
| 2002/0066905 | A1 * | 6/2002 | Wang et al. | 257/91 |
| 2007/0290220 | A1 * | 12/2007 | Wang et al. | 257/99 |
| 2008/0012036 | A1 * | 1/2008 | Loh et al. | 257/99 |
| 2012/0273826 | A1 * | 11/2012 | Yamamoto et al. | 257/99 |

FOREIGN PATENT DOCUMENTS

TW 551694 9/2003

* cited by examiner

*Primary Examiner* — John C Ingham
(74) *Attorney, Agent, or Firm* — Li & Cai Intellectual Property (USA) Office

(57) ABSTRACT

The present invention relates to an LED device, which includes a metallic frame, an LED chip, and a packaging body. The metallic frame includes a first lead frame and a second lead frame. The first lead frame has a protruding portion extending toward the second lead frame, while the second lead frame has a notch formed correspondingly to the protruding portion. An electrically insulated region is cooperatively defined by the first and second lead frames. The metallic frame defines at least one blind hole in proximate to the electrically insulated region. The LED chip is electrically connected to the first and second lead frames. The packaging body has a base portion encapsulating the metallic frame and a light-permitting portion arranged above the LED chip.

20 Claims, 11 Drawing Sheets

METALLIC FRAME STRUCTURE AND LED DEVICE HAVING THE SAME

BACKGROUND OF THE INVENTION

1. Field of the Invention

The present invention relates to a metallic frame structure and a light-emitting diode (LED) device having the same; more particularly to an LED device constructed by quad-flat no-leads (QFN) technology and a metallic frame structure thereof.

2. Description of Related Art

To improve the manufacturing process of the LEDs, the QFN technology has been developed to meet the needs. By using the QFN technology, the bottom surface of the metallic frames exposed from the encapsulated body have an advantage of better heat dissipating effect. In addition, the manufactured products have a smaller size.

Taiwan Pat. No. TW551694 titled with "Metallic Frame Structure of SMT Electronic Device" discloses a method of enhancing the combination strength between the encapsulated body and the metallic frame. By employing such method, the peel-off issue during the singulation process is addressed.

Based on the above, the present invention focuses on the LED package structure constructed by the QFN technology for further improvements. In particular, the issues of shearing force, metal burr and peeling-off during the singulation process at high temperature degrees are further addressed. Moreover, the improvement in preventing vapor from intruding the chip mounting region is also provided by the present invention. Since for the LED package structure manufactured by the QFN technology, the bottom surface of the metallic frames are exposed from the encapsulated body. The area exposed from the encapsulated body and between the lead frames of the metallic frame structure is most vulnerable to vapor intrusion. Therefore, the lighting efficiency of the LED chip is decreased due to vapor intrusion.

To address the above issues, the inventors strive via industrial experience and academic research to present the present invention, which can effectively improve the limitations described above.

SUMMARY OF THE INVENTION

The object of the present invention is to provide an LED device and a metallic frame structure thereof. An etching process is utilized to create interlocking-type lead frames and blind holes to enhance the combination strength between the metallic frame structure and the packaging body.

The other object of the present invention is to provide an LED device and a multi-segmented metallic frame structure thereof. An insulated region (most vulnerable to vapor intrusion) defined between a pair of lead frames is more resistant against vapor intrusion by means of the multi-segmented metallic frame structure. The multi-segmented metallic frame structure also enhances the combination strength between the metallic frame and the packaging body.

For advantages, the present invention eliminates the peeling issue of the lead frames during the singulation process due to the shearing force. The etching process is utilized to improve the manufacturing process and raise the yield rate. The packaged product also attains greater structural stability, which enhances product reliability and service life.

In order to further appreciate the characteristics and technical contents of the present invention, references are hereunder made to the detailed descriptions and appended drawings in connection with the present invention. However, the appended drawings are merely shown for exemplary purposes, rather than being used to restrict the scope of the present invention.

DETAILED DESCRIPTION OF THE EMBODIMENTS

First Embodiment

Figure 1:
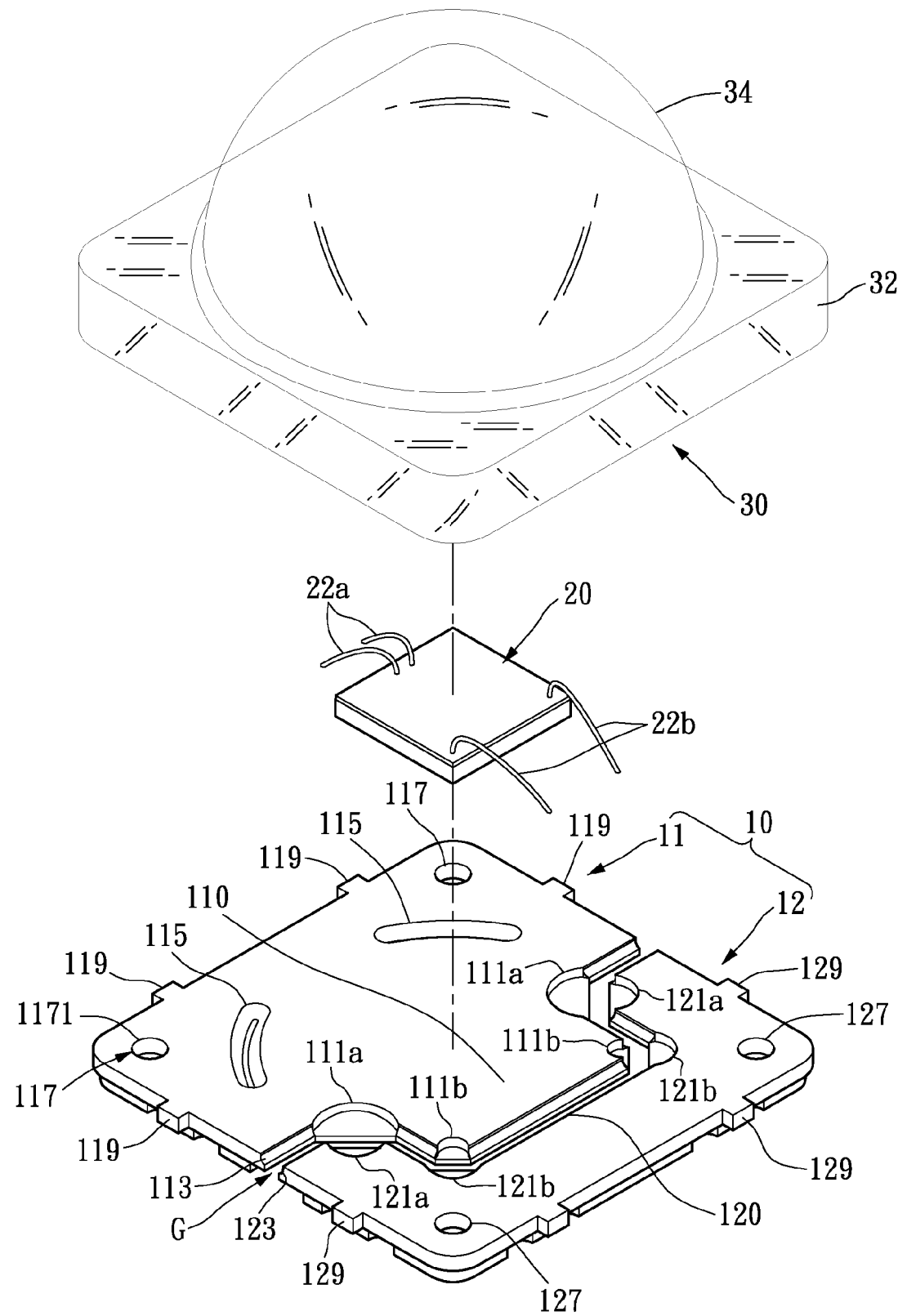
FIG. 1 is an exploded view of an LED device for a first embodiment of the present invention.

Please refer to FIG. 1, which shows an exploded view of an LED device 100 for a first embodiment of the present invention. The LED device 100 includes a metallic frame 10, a chip 20, and a packaging body 30 encapsulating the metallic frame 10 and the chip 20. A metallic frame structure is defined herein as being constructed by at least one metallic frame 10. The metallic frame 10 has an imaginary plane and includes a first lead frame 11 and a second lead frame 12. The chip 20 is an LED chip but is not restricted thereto. The chip 20 is electrically connected to the first and second lead frames 11, 12 through a pair of bonding wires 22a, 22b, respectively. The packaging body 30 has a base portion 32 for encapsulating the metallic frame 10 and a light-permitting portion 34 arranged above the chip 20. The material of the packaging body 30 may be epoxy or silicone, but is not restricted thereto.

Figure 2:
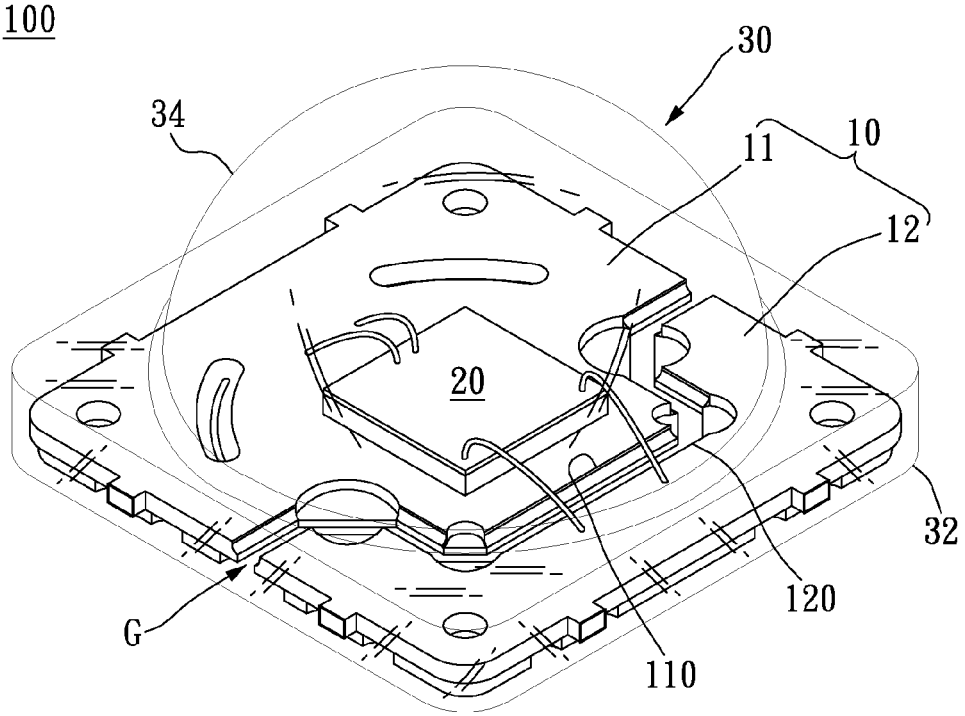
FIG. 2 is a perspective view of the LED device in FIG. 1.

Please note that FIG. 1 is for illustrative purpose only. The actual manufacturing process of the LED device 100 begins by forming the metallic frame structures 10 on a metal plate. Each metallic frame 10 has a plurality of bars 119, 129 for connecting to other metallic frame structures. Then, the chips 20 are electrically connected to the respective metallic frame structures 10 through wire bonding or the flip chip technique. The packaging bodies 30 are then utilized to encapsulate the respective metallic frame structures 10 and the chips 20. Lastly, the encapsulated metallic frame structures 10 are sawed into separated LED devices 100, as shown in FIG. 2. For the instant embodiment, the description provided herein is based on one chip 20. However, the number and type of the chips 20 are not restricted thereto. If the chip 20 emits a white light, the LED device 100 does not require fluorescent powders for mixing light. When the chip 20 emits a blue light, yellow fluorescent powders can be coated on the chip 20 or mixed with resin to form the packaging body 30 for mixing light, such that the LED device 100 can emit a white light. Moreover, when the chip 20 is an LED that produces a near-UV emission, a white light is generated either by coating a RGB phosphor on the chip 20 or mixing the RGB phosphor with the resin to form the packaging body 30.

Figure 1A:
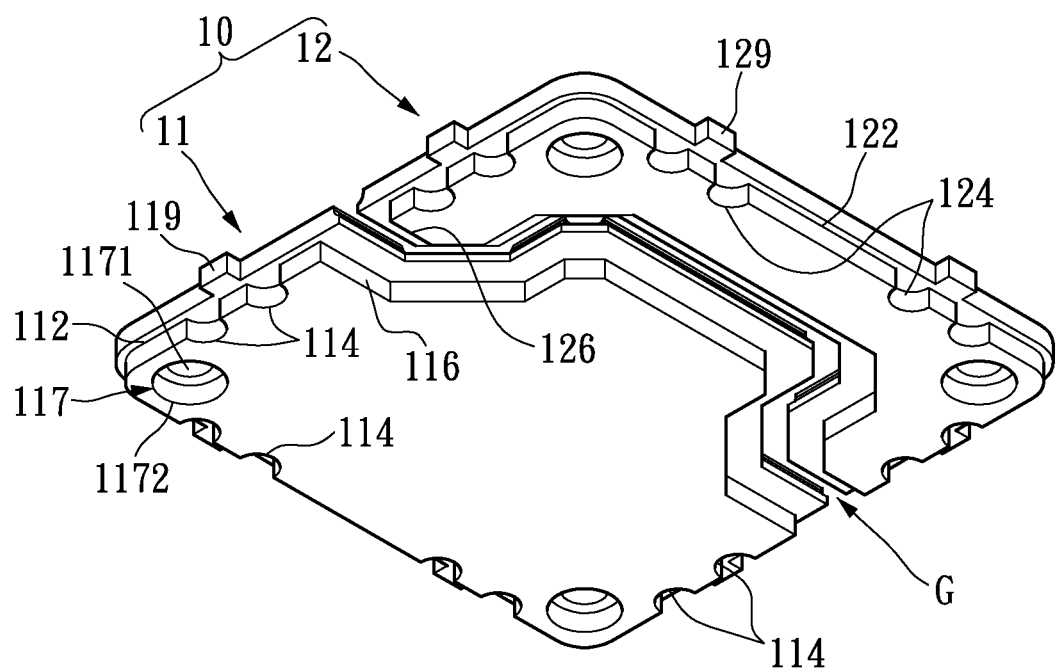
FIG. 1A is a perspective view of a metallic frame structure of the present invention.
Figure 9:
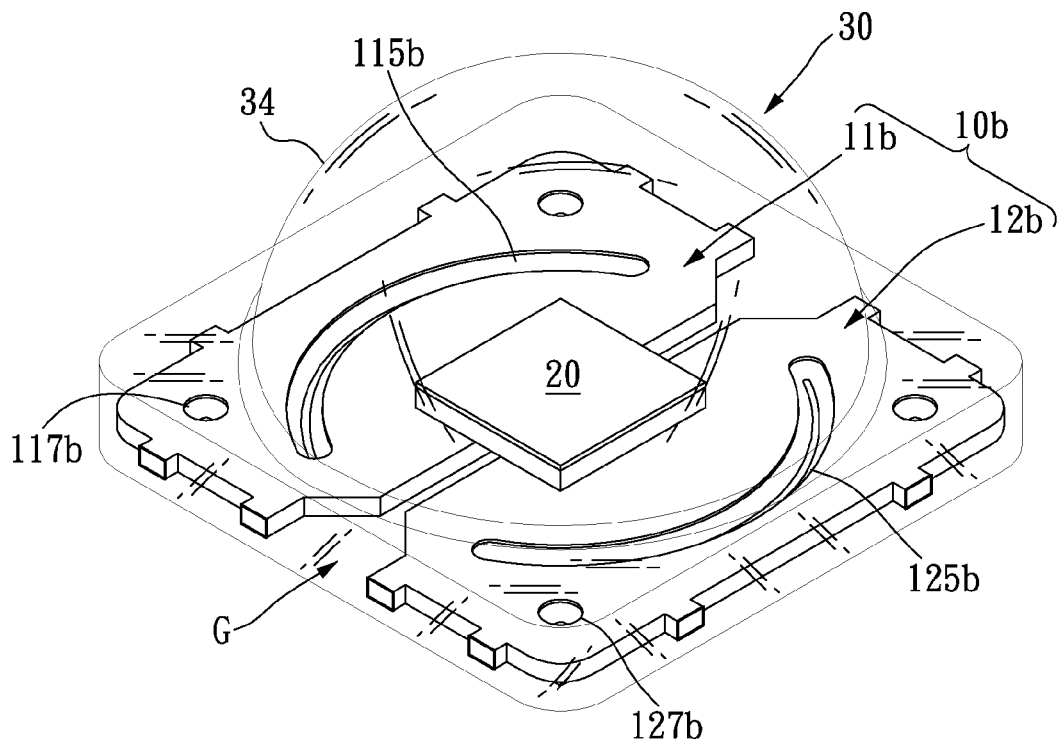
FIGS. 9 and 10 are perspective views of an LED device for a fifth embodiment of the present invention.

Please refer to FIGS. 1 and 1A, where FIG. 1A shows a perspective view of the metallic frame 10 of the present invention. The metallic frame 10 is constructed of the first lead frame 11 and the second lead frame 12. For this embodiment, one of the main features is the first and second lead frames 11, 12 are substantially shaped as interlocking-like pieces for a jigsaw puzzle. More specifically, the first lead frame 11 has a protruding portion 110 formed on one side and extended toward the second lead frame 12. Correspondingly, the second lead frame 12 has a multi-sided portion 120 facing the protruding portion 110 of the first lead frame 11. For the illustrated embodiment, this multi-sided portion is shaped as a notch 120, but is not restricted thereto. For example, the multi-sided portion can be protruding-shaped, as shown in FIG. 9. A meandering insulated region G is formed between the first and second lead frames 11, 12.

To strengthen the combination effect between the metallic frame 10 and the packaging body 30, a pair of first blind holes 115 is formed on the top surface of the first lead frame 11. Moreover, a plurality of second blind holes 111a, 111b are formed on an edge of the first lead frame 11 near the insulated region G. Similarly, a plurality of second blind holes 121a, 121b are formed on an edge of the second lead frame 12 near the insulated region G To describe in another way, a biggest circle (not labeled) is defined on the imaginary plane of the metallic frame 10. The first blind hole 115 formed concavely on an upper surface of the metallic frame 10 and located substantially adjacent to a circumference of the biggest circle.

The first blind holes 115 are arc-shaped, while the second blind holes 111a, 111b, 121a, 121b are semi-circular. The blind holes may be exposed on one side of the lead frames. A "half-blind hole" is defined herein as a blind hole drilled to approximately half the depth of the lead frame. Therefore, the definition difference between the blind holes and half-blind holes is the etching depth. For the instant embodiment, the etching process is applied to the fabrication of the metallic frame 10, particularly a structural design utilizing multiple ways of half-etching processes. The half-etching process allows a more precise control over the size of the final product and lowers the manufacturing cost. However, the shape of the blind holes is not limited to the instant exemplary embodiment.

The protruding portion 110 of the first lead frame 11 is substantially rectangular-shaped. Each corner of the protruding portion 110 forms a diagonal edge. The second blind holes 111a, 111b are formed by etching inwardly from the respective diagonal edges of the protruding portion 110. The second blind holes 111a of the first lead frame 11 are faced toward the second blind holes 121a of the second lead frame 12. Similarly, the second blind holes 111b of the first lead frame 11 are faced toward the second blind holes 121b of the second lead frame 12. The second blind holes 111a, 111b are formed along an upper edge of the first lead frame 11, while the second blind holes 121a, 121b are formed along an upper edge of the second lead frame 12. These second blind holes 111a, 111b, 121a, 121b are semi-circular shaped with an etching depth less than half the thickness of the metallic frame 10. For the aforementioned embodiment, the protruding portion 110 is rectangular shaped but is not limited thereto. The shape of the protruding portion 110 may depend on the shape of the chip 20 or how the chip 20 is arranged. For example, depending on the designer's preference, the protruding portion 110 may be multi-sided or arc-shaped. For the first lead frame 11, the second blind holes 111a, 111b may be selected from the group consisting of large and small semi-circular blind holes. In other words, the second blind hole 111a-111b of the first lead frame 11 and the second blind hole 121a-121b of the second lead frame 12 are respectively selected from two sizes. For example, both are large semi-circular blind holes, or both are small semi-circular blind holes, or one is large semi-circular blind holes and the other is small semi-circular blind holes. Same configuration may be applied to the second lead frame 12. However, the exact combination of the blind holes for the first and second lead frames 11, 12 are not restricted thereto.

Regardless the number or type of the blind holes, at least one blind hole is formed on the metallic frame 10.

The advantage of the instant embodiment is by utilizing the convex-concave matching shapes of the first and second lead frames 11, 12 and the meandering path of the insulated region G, the combination strength between the metallic frame 10 and the packaging body 30 is improved. The second blind holes 111a, 111b, 121a, 121b also contribute toward increasing the combination strength between the metallic frame 10 and the packaging body 30. For the inventors' prior invention, the insulated region between the lead frames is formed linearly. In comparison, during the sawing operation of the semiconductor devices, the present invention prevents the packaging body from peeling off the lead frames.

Please refer to FIG. 1A, which shows a perspective view of the metallic frame 10 of the present invention. The bottom portion of the metallic frame 10 is modified to provide additional improvements. Namely, the bottom peripheral edge portion of the metallic frame 10 is recessed inward in forming peripheral stepped structures 112, 122. The peripheral stepped structures 112, 122 are formed on the bottom surface of the metallic frame 10. Moreover, the first lead frame 11 has a plurality of third blind holes 114 formed concavely on the stepped structure 112. In a similar fashion, the second lead frame 12 has a plurality of third blind holes 124 formed concavely on the stepped structure 122. For the instant embodiment, the third blind holes 114, 124 are semi-circular half-blind holes. Each side of the metallic frame 10 has two pairs of third blind holes 114, 124 formed thereon. In addition, a plurality of bars 119, 129 is protruded from the edges of the metallic frame 10 for interconnecting to other metallic frame structures (not shown). The utilization of the peripheral stepped structures 112, 122 and the bars 119, 129 reduces the sawing thickness of the metallic frame structure and the occurrence of metal burr when the singulation process is applied. Besides, the time takes to singulate the semiconductor devices during a high temperature process may be reduced. The reduction in metal burr makes the metallic frame 10 less vulnerable to vapor intrusion at the sawing points during the singulation process. The reduction in metal burr also makes the packaging body less likely to peel off during the high temperature manufacturing process. Meanwhile, the third blind holes 114, 124 strengthen the combination capacity of the packaging body 30 to the first and second lead frames 11, 12.

It is worth noting the third blind holes 114, 124 are arranged in correspondence to the positions of the bars 119, 129. Namely, the two neighbor third blind holes 114, 124 are arranged in close to opposite sides of the corresponding bar 119, 129. Thus, the packaging body 30 may join to the third blind holes 114 near opposite sides of the corresponding bar 119 and the third blind holes 124 near opposite sides of the corresponding bar 129. Thereby, the combination capacity between the first and second lead frames 11, 12 and the packaging body 30 is strengthened. In other words, when sawing through the bars 119, 129 between adjacent metallic frame structures 10, the packaging body 30 is tightly fixed to the first and second lead frames 11, 12 through the third blind holes 114, 124. The enhanced combination strength makes the packaging body 30 less likely to peel off from the metallic frame 10.

Please refer to FIGS. 1 and 2. The first blind holes 115 are formed concavely on the top surface of the first lead frame 11 and under the light-permitting portion 34. In other words, the first blind holes 115 may be formed anywhere on the first lead frame 11 within the area defined by the inner diameter of the light-permitting portion 34. Preferably, the first blind holes 115 are located substantially adjacent to and along to a circumference of the light-permitting portion 34. The first blind holes 115 enhance the combination capacity between the light-permitting portion 34 and the metallic frame 10. However, the first blind holes 115 are not restricted to forming on the first lead frame 11. In other words, the first blind holes 115 only need to be formed on the top surface of the metallic frame 10, preferably at or close to the perimeter defined by the light-permitting portion 34. Additional discussion is provided hereinbelow through different embodiments.

Figure 3:
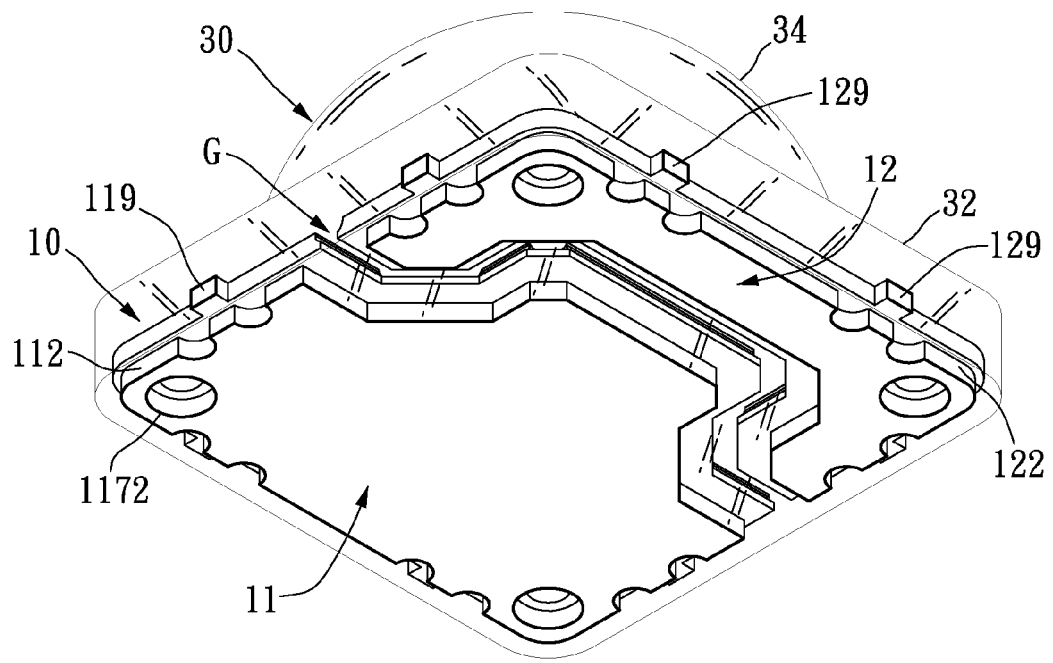
FIG. 3 is another perspective view of the LED device in FIG. 1.

Please refer to FIGS. 1, 1A, and 3. The metallic frame 10 further defines a plurality of through holes 117, 127. The through holes 117, 127 are formed on the corner regions of the first and second lead frames 11, 12 without being covered by the light-permitting portion 34. The through holes 117, 127 are substantially reverse-T shaped. As shown in FIG. 1, the through hole 117 is defined by an upper hole portion 1171 exposed on the top surface of the first lead frame 11. Whereas FIG. 1A shows the through hole 117 is also defined by a lower hole portion 1172 exposed on the bottom surface of the first lead frame 11, where the diameter of the lower hole portion 1172 is greater than that of the upper hole portion 1171. When the packaging material is filled into the through holes 117, 127, the packaging body 30 is combined securely to the metallic frame 10 through the reverse T-shaped structure of the through holes 117, 127. Thus, the combination capacity between the packaging body 30 and metallic frame 10 is strengthened. The strengthened combination capacity also reduces vapor intrusion.

Regardless the number or type of the through holes, at least one through hole is formed on the metallic frame 10.

Please refer back to FIGS. 1 and 1A. The LED device 100 of the present invention has another feature. The upper grooves 113, 123 are formed on the top surface of the first lead frame 11 and the second lead frame 12, respectively, near the insulated region G. Correspondingly, the lower grooves 116, 126 are formed on the bottom surface of the first lead frame 11 and the second lead frame 12, respectively, near the insulated region G. The upper grooves 113, 123 and the lower grooves 116, 126 are formed by the partial-etching technique applied to the surfaces of the first and second lead frames 11, 12.

Figure 4:
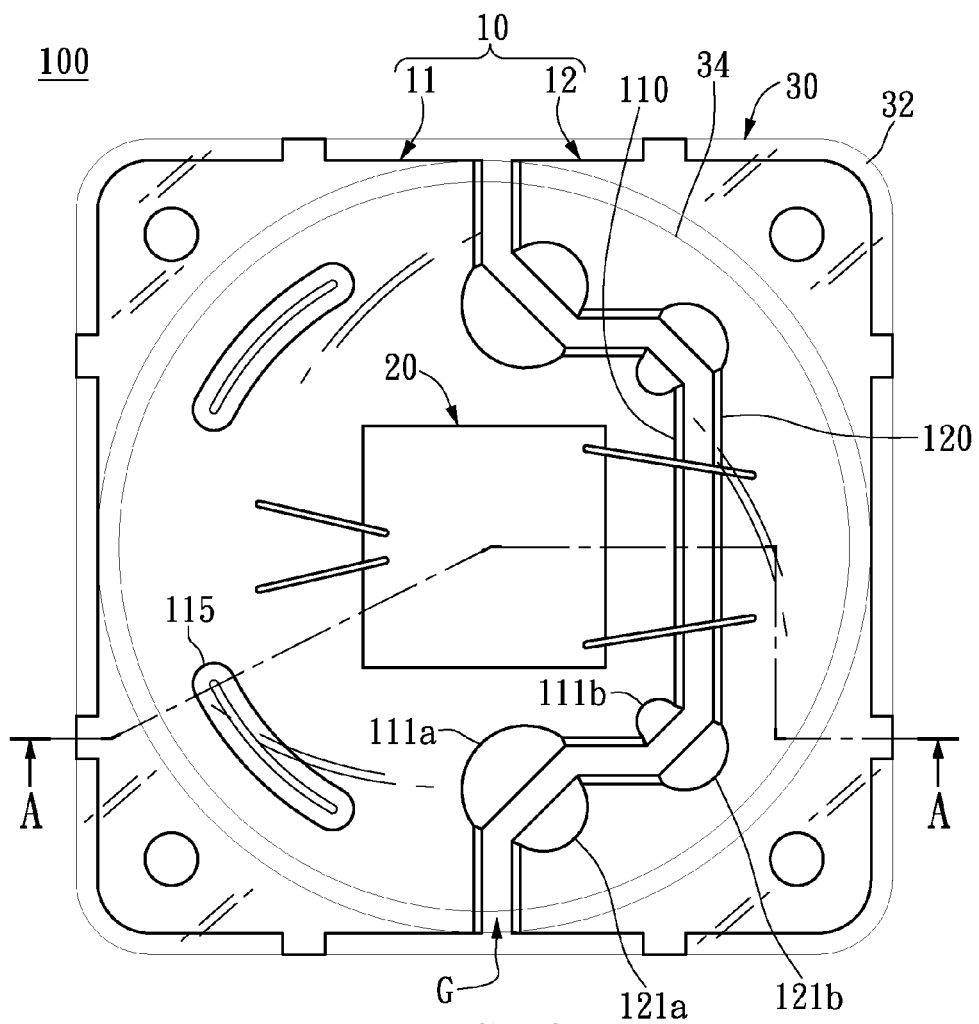
FIG. 4 is a top view of the LED device in FIG. 2.
Figure 4A:
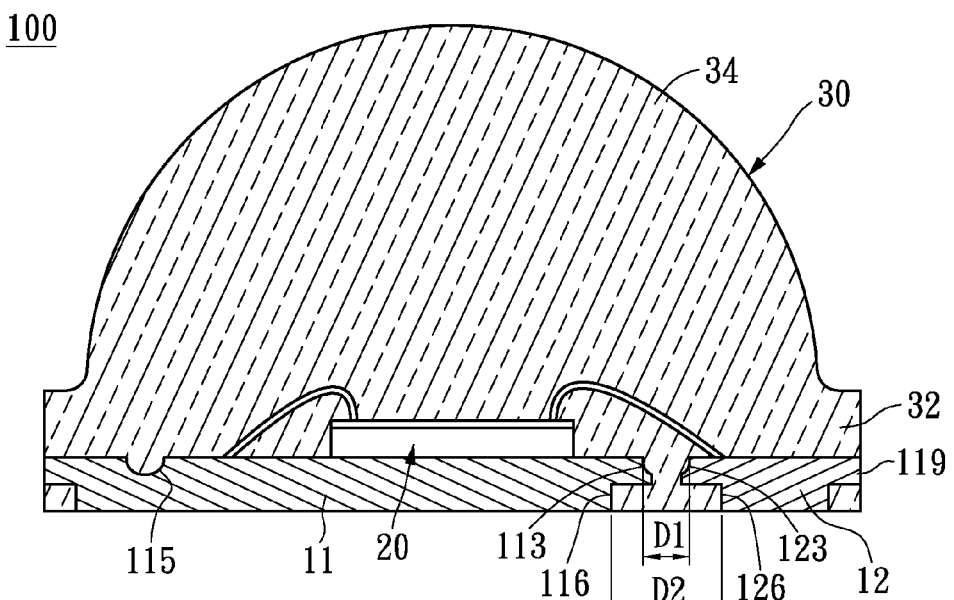
FIG. 4A is a cross-sectional view of the LED device along a cut-line AA in FIG. 4.

Please refer to FIGS. 4 and 4A. FIG. 4 is a top view of the LED device 100 for the instant embodiment, while FIG. 4A is a cross-sectional view of the LED device 100 for the instant embodiment taken along a cut-line AA in FIG. 4. The upper grooves 113, 123 are defined by a curved cross-section, while the lower grooves 116, 126 are defined by a straight-edge cross-section. The distance separating the upper grooves 113, 123 is greater than the width of the insulated region G. Meanwhile, the distance separating the lower grooves 116, 126 is greater than that of the upper grooves 113, 123. The lower grooves 116, 126 defined by the first and second lead frames 11, 12 are separated by a corresponding distance greater than that between the upper grooves 113, 123. Thus, a multi-segmented structure is provided to prevent vapor intrusion. This multi-segmented structure is formed on opposite surfaces of the metallic frame 10 and opposite sides of the insulated region G. Such arrangement is for addressing the vapor intrusion phenomenon which usually occurs at the insulated region G, especially through the bottom surface of the metallic frame 10. The three-steps structure enables further prevention against vapor intrusion and enhances the combination capacity between the packaging body 30 and the metallic frame 10. It is worth noting the lower grooves 116, 126 may also have a curved cross-section and is not restricted to the straight-edge configuration of the exemplary embodiment.

Second Embodiment

Figure 5:
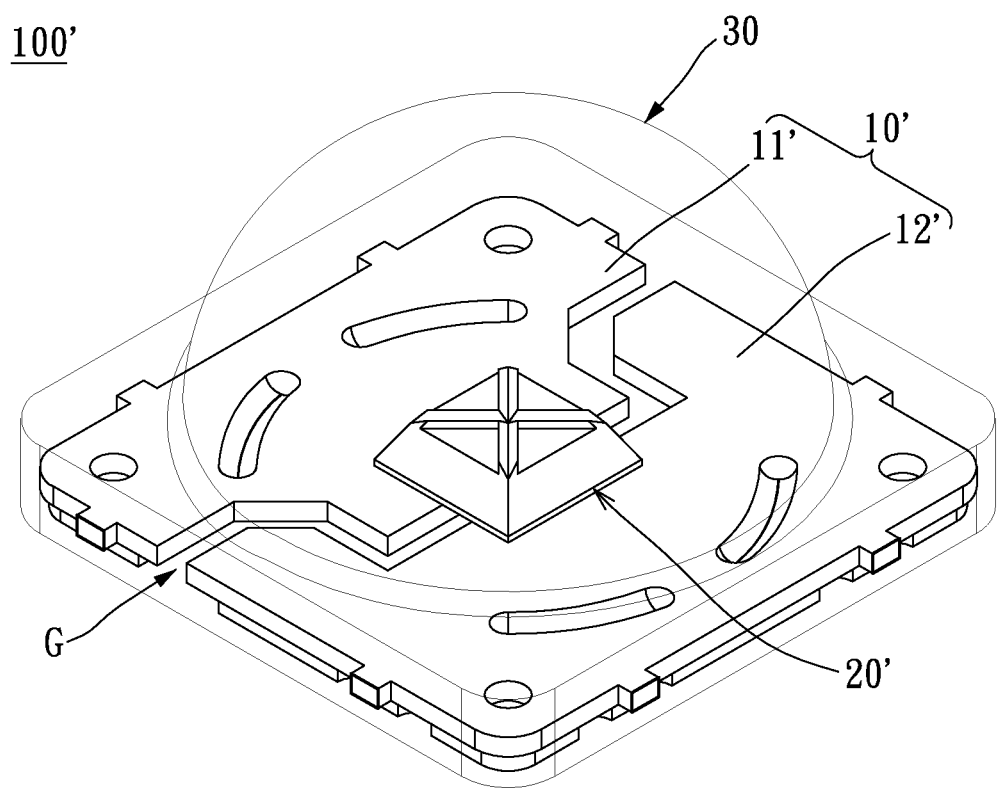
FIG. 5 is a perspective view of an LED device for a second embodiment of the present invention.

Please refer to FIG. 5, which shows a perspective view of an LED device 100' for a second embodiment of the present invention. The LED device 100' of the instant embodiment differs from the previous embodiment by having an LED chip 20' interconnected by the flip-chip method. The bottom surface of the chip 20' is in direct electrical connection to a first lead frame 11' and a second lead frame 12'. Thus, the usage of the metal wires can be reduced to save the material cost. In addition, wire breakage due to the mismatch in coefficient of thermal expansion (CTE) between the metallic frame 10 and the packaging body 30 is less likely to occur.

Third Embodiment

Figure 6:
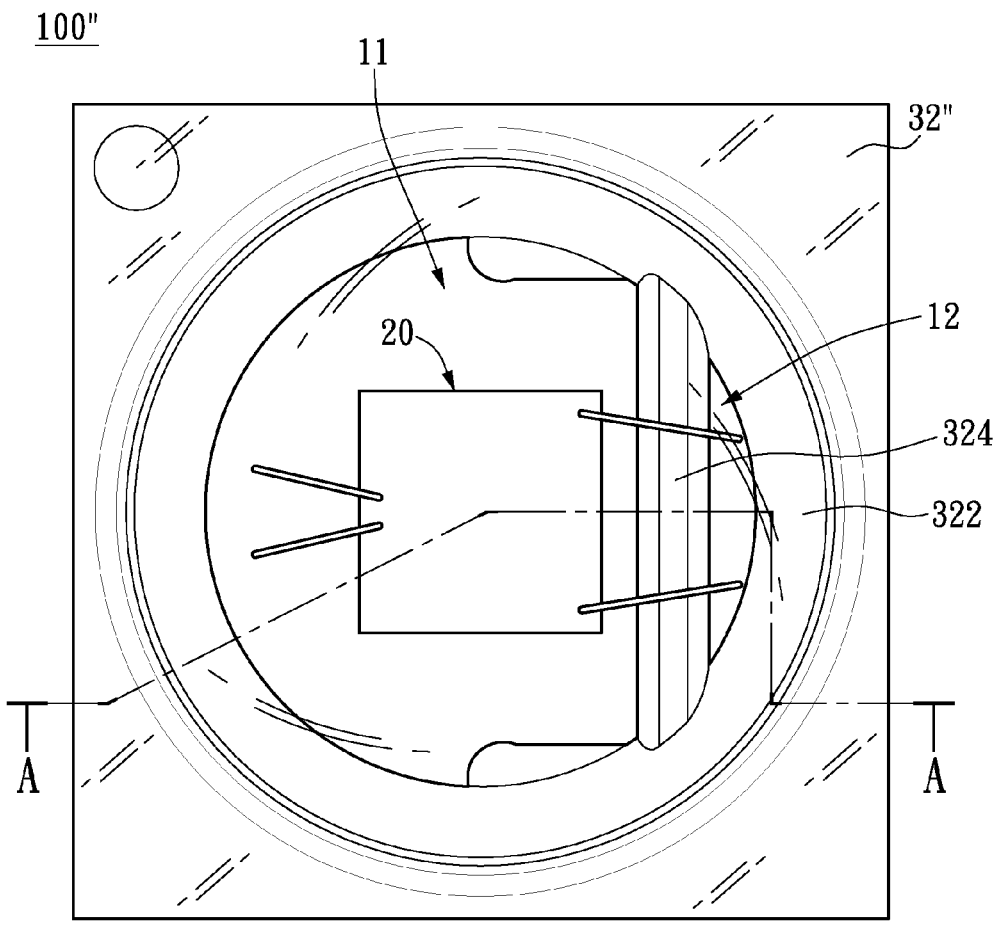
FIG. 6 is a top view of an LED device for a third embodiment of the present invention.
Figure 6A:
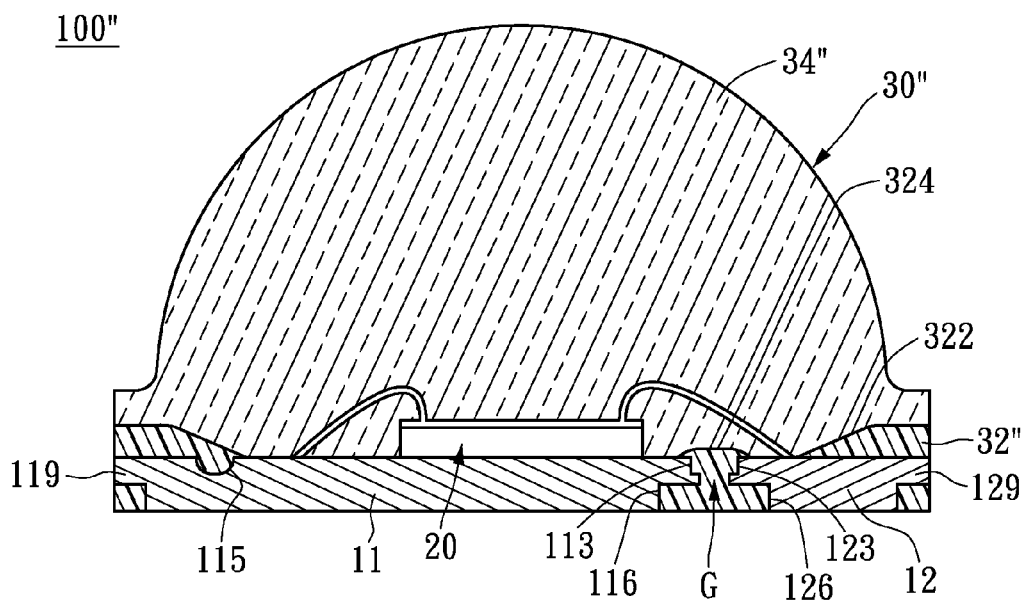
FIG. 6A is a cross-sectional view of the LED device along a cut-line AA in FIG. 6.

Please refer to FIGS. 6 and 6A. FIG. 6 is a top view of an LED device 100" for a third embodiment of the present invention. FIG. 6A is a cross-sectional view of the LED device 100" taken along a cut-line AA in FIG. 6. Differing from the previous embodiments, a packaging body 30" has a non-light transmitting base portion 32" and a light-permitting portion 34". The non-light transmitting base portion 32" may be made of a white plastic material arranged on the first and second lead frames 11, 12. Since the base portion 32" is non-transparent, the blind holes are not shown in FIG. 6. As shown in FIG. 6A, the first blind holes 115 is covered by the non-light transmitting base portion 32" for increasing the combination strength between the first lead frame 11 and the base portion 32". The light-permitting portion 34" may be constructed of silicone.

The base portion 32" has a receiving space formed above the first and second lead frames 11, 12 for receiving the LED chip 20 therein, an annular light-reflecting surface 322 and a rib 324 penetrating the insulated region G. The light-reflecting surface 322 surrounds the receiving space. The light-reflecting surface 322 and the rib 324 can be made of light-reflecting material. More specifically, the rib 324 penetrates the three-steps structure and protrudes from the top surfaces of the first and second lead frames 11, 12. The rib 324 has a rivet-like cross-section. It is worth noting that the protruded portion of the rib 324 may have a trapezoid-shaped structure. The trapezoid-shaped structure seals the insulated region G as a stopper to prevent water vapor from intruding the chip 20. Thus, the reliability of the LED device 100" can be enhanced. The aforementioned light-reflecting surface 322 promotes light concentration for the LED chip 20. The base portion 32" not only provides protection against vapor intrusion, but also enhances the combination capacity between the packaging body 30″ and the first and second lead frames 11, 12. However, the structural configuration of the rib 324 is not restricted to the exemplary embodiment. For example, the rib 324 may be flushed with the top surfaces of the first and second lead frames 11, 12.

Fourth Embodiment

Figure 7:
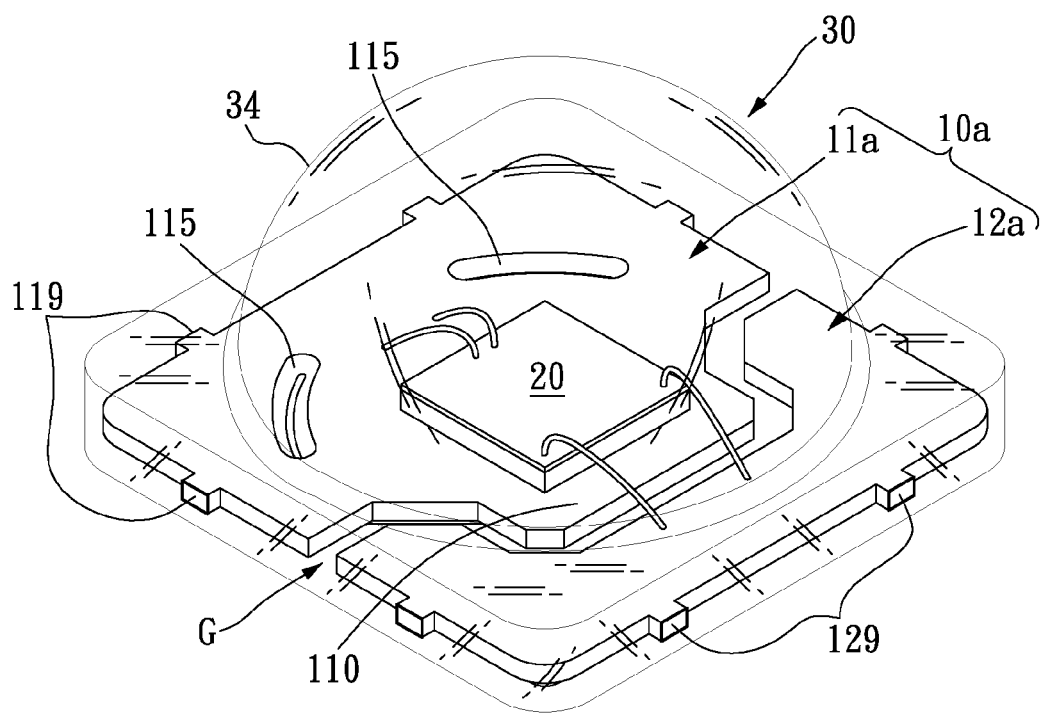
FIGS. 7 and 8 are perspective views of an LED device for a fourth embodiment of the present invention.
Figure 8:
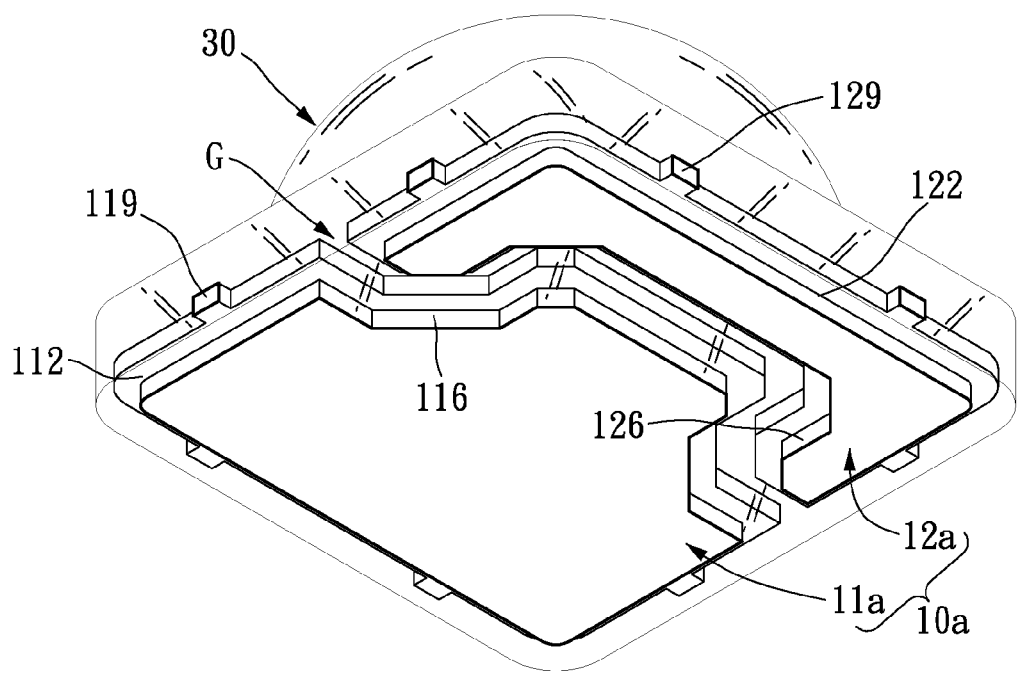

Please refer to FIGS. 7 and 8, which show the perspective views of the LED device for a fourth embodiment of the present invention. In comparing to the first embodiment, the instant embodiment illustrates the feature of the present invention in a simplified fashion. A metallic frame 10a includes a protruding first lead frame 11a and a notched second lead frame 12a. Thus, the combination capacity between the packaging body 30 and metallic frame 10a is enhanced. The first lead frame 11a has a protruding portion 110 directed toward one side of the second lead frame 12a. The first lead frame 11a further defines two first blind holes 115 on the top surface thereof. The first blind holes 115 are formed within a region defined by the inner diameter of the light-permitting portion 34. The first blind holes 115 enhance the combination strength between the packaging body 30 and the first lead frame 11a. Similar to the first embodiment, the metallic frame 10a has the peripheral stepped structure 112, 122 formed concavely on a periphery of the bottom surface thereof. The lower grooves 116, 126 are formed concavely on the bottom surface of the first lead frame 11a and the second lead frame 12a, respectively, near the insulated region G. In comparing to the first embodiment, the LED device of the instant embodiment is without the second blind holes (i.e., half-blind holes formed on the edges of the lead frames and near the insulated region) and the third blind holes (i.e., half-blind holes formed near opposite sides of the bars). As shown by the multi-segmented structure in FIG. 4A, the etching process of the instant embodiment is simplified. For the instant embodiment, light-permitting material is used for packaging the metallic frame 10a, but is not restricted thereto. Like the third embodiment, the packaging body 30 may include the non-light transmitting base portion and the light-permitting portion.

Fifth Embodiment

Figure 10:
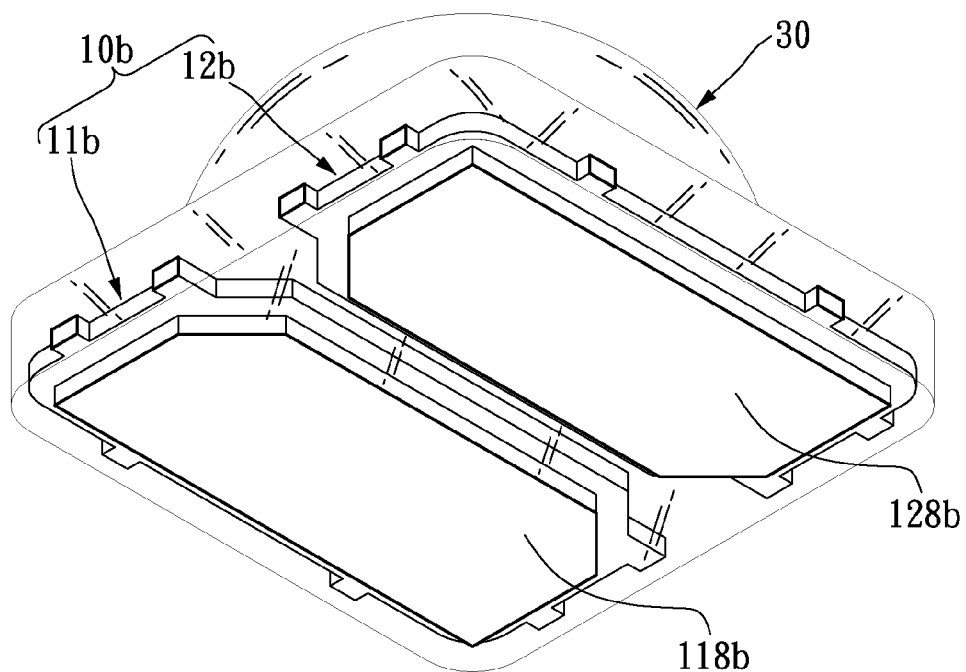

Please refer to FIGS. 9 and 10, which show the perspective views of an LED device for a fifth embodiment of the present invention. In comparing to the first embodiment, a metallic frame 10b of the instant embodiment includes a protruding first lead frame 11b and a protruding second lead frame 12b. The first and second lead frames 11b and 12b are symmetrical and cooperatively define an I-shaped insulated region G. In particular, the insulated region G is defined by a pair of opposite ends that is substantially Y-shaped. The Y-shaped regions allow the receival of more packaging material and enables the LED device to be less vulnerable during the singulation process. Since the first and second lead frames 11b and 12b have equal surface area, the LED chip 20 can be wire bonded with more ease to the metallic frame 10b. The metallic frame 10b is also more suitable for interconnecting the LED chip 20 by the flip-chip method. The first and second lead frames 11b, 12b further define an expanded first blind holes 115b, 125b, respectively, on the top surface thereof. Moreover, the first and second lead frames 11b, 12b define a pair of circular blind holes 117b, 127b, respectively, near the top corner portion thereof. Besides having the advantages associated with the first embodiment, the packaging body 30 may be bonded uniformly to either the top or bottom surface the first and second lead frames 11b, 12b. For the instant embodiment, light-permitting material is used for packaging the metallic frame 10b, but is not restricted thereto. Like the third embodiment, the packaging body 30 may include the non-light transmitting base portion and the light-permitting portion.

The first lead frame 11b and the second lead frame 12b each has a solder pad 118b, 128b arranged respectively on the bottom surface thereof. The solder pads 118, 128b are symmetrical, which allow an uniform distribution of the solder and reach thermal equilibrium.

Sixth Embodiment

Figure 11:
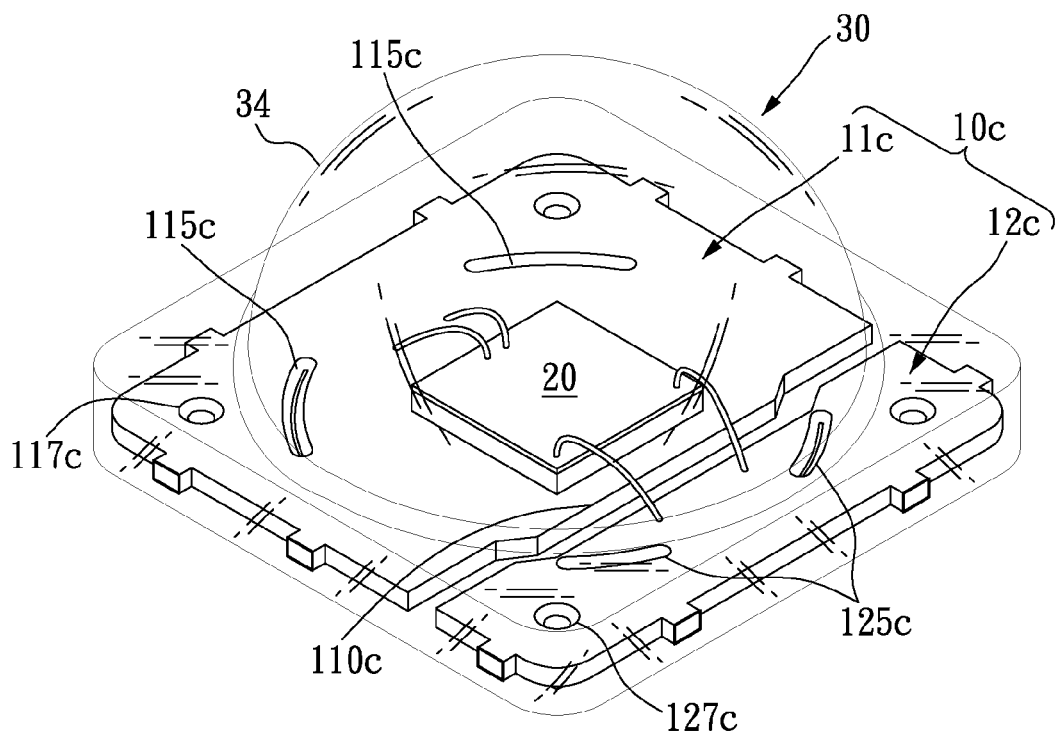
FIGS. 11 and 12 are perspective views of an LED device for a sixth embodiment of the present invention.
Figure 12:
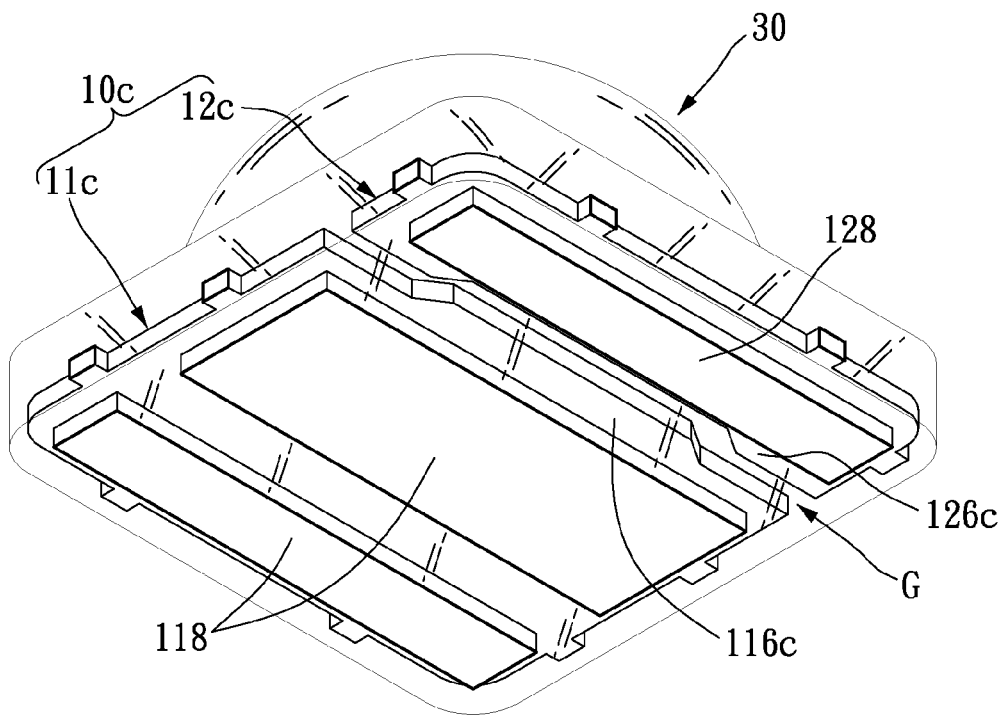

Please refer to FIGS. 11 and 12, which are the perspective views showing an LED device for a sixth embodiment of the present invention. A metallic frame 10c of the instant embodiment includes a protruding first lead frame 11c and a notched second lead frame 12c. In particular, the first lead frame 11c has a protruding portion 110c, where the protruding portion 110c is less protruded than the previous embodiment. The first and second lead frames 11c, 12c define a pair of curved first blind holes 115c, 125c, respectively, on the top surfaces thereof. Moreover, the first and second lead frames 11c, 12c define a pair of circular blind holes 117c, 127c, respectively, near the top corner portions thereof. The first blind holes 115c and 125c are arranged symmetrically along the inner perimeter of the light-permitting portion 34 and surround the LED chip 20. Thus, the combination capacity between the packaging body 30 and the metallic frame 10c is enhanced.

In comparing to the fifth embodiment, the first lead frame 11c has a larger surface area than that of the second lead frame 12c. For example, two solder pads 118 are accommodated on the bottom surface of the first lead frame 11c. Whereas the second lead frame 12c has only one solder pad 128. Since the first lead frame 11c has two solder pads 118, the gap defined between the solder pads 118 is also filled with packaging glue. Thus, the combination strength between the metallic frame 10c and the packaging body 30 is enhanced. For the instant embodiment, light-permitting material is used for packaging the metallic frame 10c but is not restricted thereto. Like the third embodiment, the packaging body 30 may include the non-light transmitting base portion and the light-permitting portion.

By having three solder pads 118, 128 on the bottom surface of metallic frame 10c, the metallic frame 10c can be soldered more easily to the circuit board and dissipate heat. On the other hand, the first and second lead frames 11c, 12c define a pair of straight-edged lower grooves 116c, 126c, respectively, on the bottom surfaces thereof near the insulated region G. In other words, a pair of symmetrical and linear grooves is defined between the solder pads 118 and 128. Thus, the combination force between the packaging body 30 and the bottom surface of the metallic frame 10c is more uniformly distributed. The arrangement of the solder pads 118, 128 allows a uniform distribution of the solder and reaches thermal equilibrium. The package material filled between the solder pads 118 and 128 provides additional combination means for the metallic frame 10c to the packaging gel.

Seventh Embodiment

Figure 13:
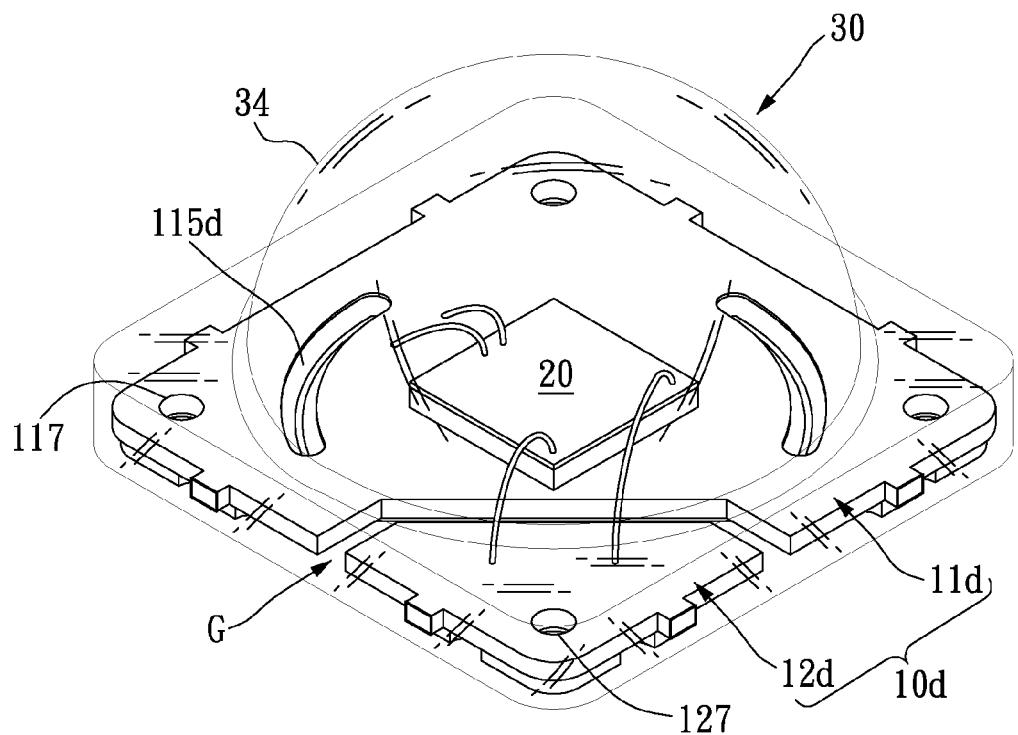
FIGS. 13 and 14 are perspective views of an LED device for a seventh embodiment of the present invention.
Figure 14:
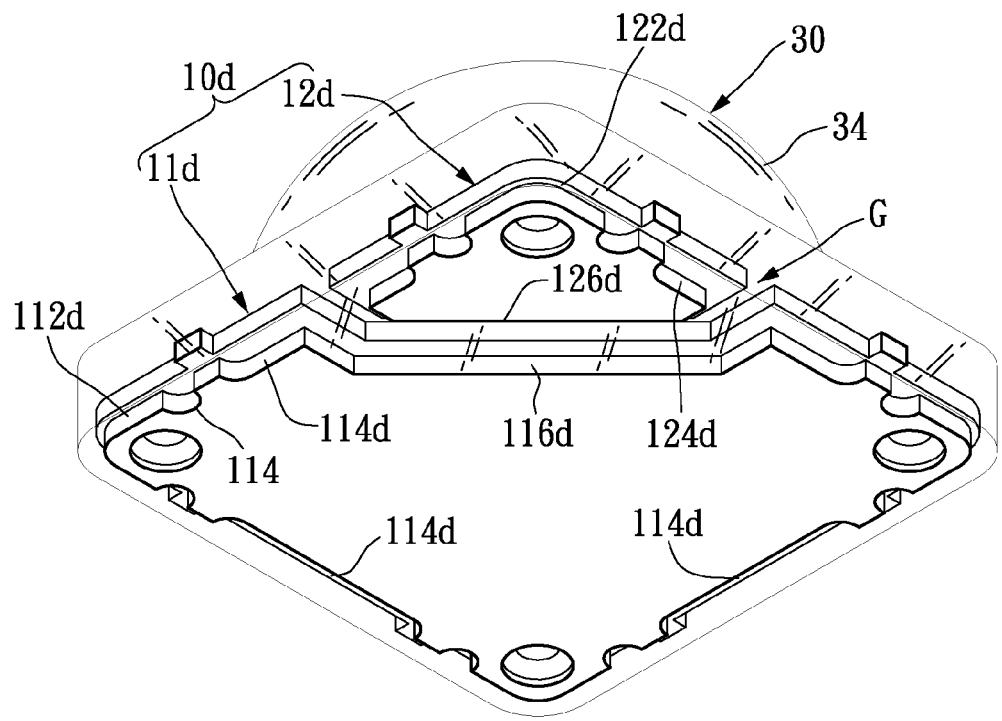

Please refer to FIGS. 13 and 14, which show an LED device for a seventh embodiment of the present invention. The LED device includes a metallic frame 10d, which includes a pair of substantially diamond shaped first lead frame 11d and second lead frame 12d. The first and second lead frames 11d and 12d are substantially pentagonal. Unlike the previous embodiments, the insulated region G between the first and second lead frames 11d and 12d extends from one side of the metallic frame 10d to an adjacent side thereof. Therefore, the insulated region G of the instant embodiment is shorter versus previous embodiments. The shorter insulated region G allows less intruding area by the vapor content.

A pair of first blind holes 115d may be curved and formed symmetrically on the first lead frame 11d and surround the LED chip 20. Thus, the combination strength between the packaging body 30 and the metallic frame 10d is enhanced. The first lead frame further defines three T-shaped through holes 117. Whereas the second lead frame only has one T-shaped through hole 127 formed thereon. The through holes 117 and 127 are preferably formed on the corner portions of the first and second lead frames 11d and 12, respectively. Thus, the combination strength between the packaging body 30 and the metallic frame 10d is enhanced.

Moreover, peripheral stepped structures 112d, 122d are formed peripherally on the bottom edge portion of the first and second lead frames 11d and 12d, respectively. Third blind holes 114d and 124d are formed concavely on the stepped structures 112d and 122d, respectively. The third blind holes 114d and 124d may be shaped semi-circularly or have an elongated shape. The third blind holes 114 and 124d that have elongated shape are arranged in the central portion of each side of the metallic frame 10d. Whereas the semi-circular shaped third blind holes 114 and 124d are arranged near the corner portions of the metallic frame 10d. Thus, the combination strength between the packaging body 30 and the metallic frame 10d is enhanced and uniformly distributed. A lower grooves 116d, 126d are formed on the bottom edge portion of the first and second lead frames 11d and 12d, respectively, facing toward the insulated region G. The lower grooves 116d and 126d are in communication with the stepped structures 112d and 122d, respectively. For the instant embodiment, the third blind holes 114d and 124d are preferably arranged in close to the opposite sides of the corresponding bar. The shape of the third blind holes 114d and 124d may be elongated or semi-circular. Thus, any combination of semi-circular or elongated third blind holes 114d and 124d may be adopted near opposite sides of the corresponding bar.

Since the first lead frame 11d has a greater bottom surface area, the generated heat can be dissipated more effectively. For the instant embodiment, light-permitting material is used for packaging the metallic frame 10d but is not restricted thereto. Like the third embodiment, the packaging body 30 may include the non-transparent base portion and the light-permitting portion.

Eighth Embodiment

Figure 15:
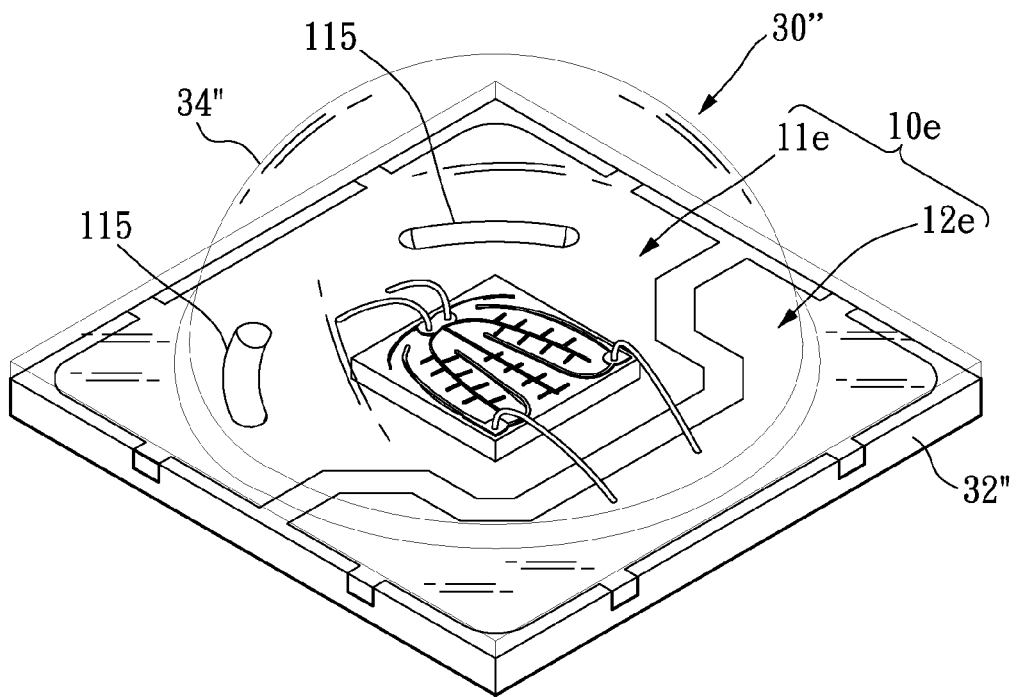
FIGS. 15 and 16 are perspective views of an LED device for an eighth embodiment of the present invention.
Figure 16:
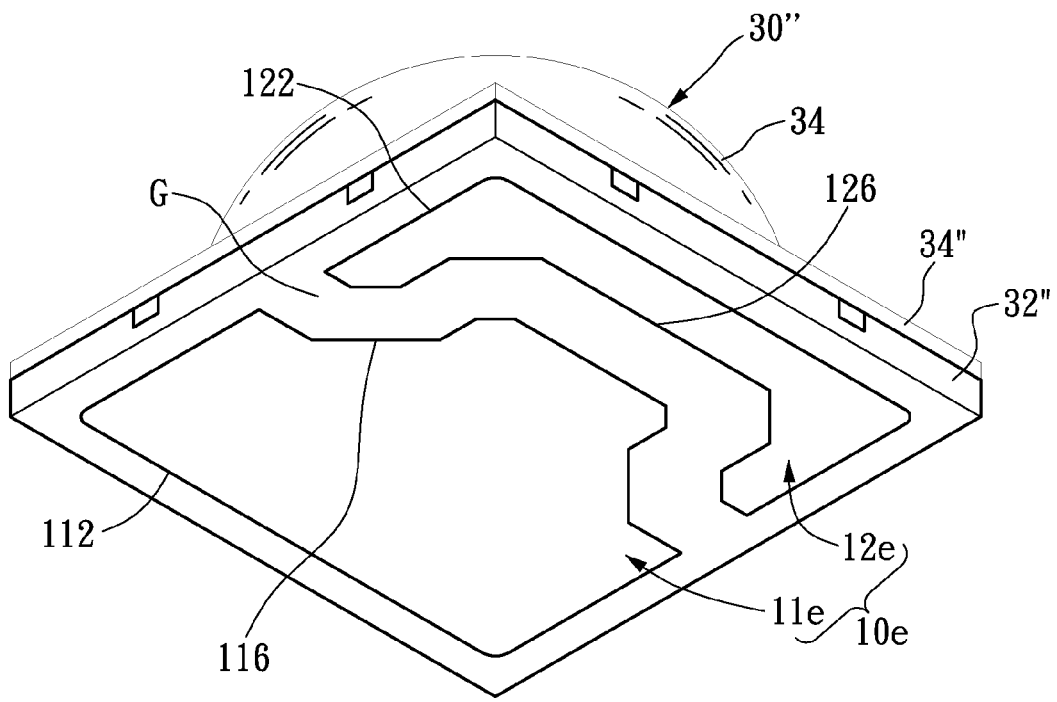

Please refer to FIGS. 15 and 16, which show an LED device for an eighth embodiment of the present invention. The LED device has similar structural configuration as the third embodiment. Namely, the packaging body 30" has the non-light transmitting base portion 32" and the light-permitting portion 34". The difference is that the thickness of the non-light transmitting portion 32" of the instant embodiment is substantially equal to the thickness of a metallic frame 10e. In other words, the base portion 32" is flushed with the top and bottom surfaces of the metallic frame 10e. As shown in the figures, the structural configuration of a first lead frame 11e and a second lead frame 12e of the metallic frame 10e is similar to the fourth embodiment. Two first blind holes 115 are formed on the top surface of the first lead frame 11e along the perimeter of the light-permitting portion 34. Thus, the combination strength between the light-permitting portion 34 and the first lead frame 11e is enhanced. Stepped structures 112 and 122 are formed concavely around the periphery of the bottom edge portion of the metallic frame 10e. Near the insulated region G, the grooves 116 and 126 are formed on the bottom surfaces of the first and second lead frames 11e and 12e, respectively. In comparing to the third embodiment, the packaging body 30" is without the light-reflecting surface 322. Thus, the usage of packaging material is reduced, which also lowers the total height of the LED device. Moreover, the instant embodiment utilizes the non-light transmitting base portion 32" to encapsulate the metallic frame 10e, where the non-light transmitting base portion 32" is in flushed with the top and bottom surfaces of the metallic frame 10e. In comparing to the fourth embodiment, the instant embodiment provides a greater mechanical strength between the packaging body 30" and the metallic frame 10e.

The LED device and the metallic frame structure thereof of the present invention have the following advantages. Namely, the interlocking-type lead frames 11 and 12 and the second blind holes 111a, 111b, 121a, 121b eliminates the peeling off issue between the packaging body 30 and the lead frames 11 and 12 during the singulation process. The peripheral stepped structures 112 and 122 reduce the sawing thickness of the metallic frame structure when the singulation process is applied. The reduced thickness inflicts less wear on the cutting tool and the metal burr is less likely to occur. Therefore, the LED device can have a more precise dimension and better yield rate for the soldering operation. The third blind holes 114, 124, the first blind holes 115, and the T-shaped through holes 117, 127 strengthen the combination capacity between the packaging body 30 and the lead frames 11, 12. The bars 119 and 129 reduce the occurrence of vapor intrusion during the singulation process. The multi-segmented structure provides structural reinforcement for the insulated region, extends the travelling path for the vapor content, and intensify the combination strength between the lead frames and the packaging body. Moreover, when applying the flip-chip method, the usage of the metal wires may be reduced and wire breakage due to thermal stress caused by CTE mismatch is less likely to occur. In addition, the half-etching technique is capable of increasing the product yield rate, besides increasing the stability of the packaging process and the reliability and service life of the product.

The descriptions illustrated supra set forth simply the preferred embodiments of the present invention; however, the characteristics of the instant disclosure are by no means restricted thereto. All changes, alternations, or modifications conveniently considered by those skilled in the art are deemed to be encompassed within the scope of the present invention delineated by the following claims.

What is claimed is:
1. A metallic frame structure, comprising:
a metallic frame having an imaginary plane and including
a first lead frame having a protruding portion;
a second lead frame, the protruding portion extending toward the second lead frame; and
an electrically insulated region defined between the first and second lead frames;
wherein a biggest circle is defined on the imaginary plane;
wherein at least one first blind hole and at least one second blind hole are selectively formed on at least one of the first lead frame and the second lead frame, the first blind hole formed concavely on an upper surface of the metallic frame and located substantially adjacent to a circum- ference of the biggest circle, and the second blind hole formed in proximate to the electrically insulated region; wherein the at least one first blind hole is distributed around the chip-mounting area that the at least one chip is mounted thereon, and the at least one second blind hole is communicated with the electrically insulated region.

2. The metallic frame structure of claim 1, wherein the first blind hole is arc-shaped.

3. The metallic frame structure of claim 1, wherein at least two second blind holes are respectively formed on an upper surface of the first and second lead frames in proximate to the electrically insulated region, and the second blind hole formed on the first lead frame is in position corresponding to the second blind hole formed on the second lead frame.

4. The metallic frame structure of claim 1, wherein each corner of the protruding portion is formed with a diagonal edge, and the second blind hole is formed by etching inwardly from the corresponding diagonal edge.

5. The metallic frame structure of claim 4, wherein the second blind hole having a semi-circular shape is formed by etching inwardly from the corresponding diagonal edge of the protruding portion.

6. The metallic frame structure of claim 5, wherein the at least one second blind hole formed selectively on the first lead frame and the second lead frame is selected from the group consisting of large and small semi-circular blind holes.

7. The metallic frame structure of claim 1, wherein a depth of the second blind hole is less than half thickness of the metallic frame, and the thickness of the metallic frame is defined by an upper surface and an lower surface of the metallic frame.

8. The metallic frame structure of claim 1, wherein the metallic frame has a stepped structure formed concavely and peripherally on the bottom surface thereof.

9. The metallic frame structure of claim 8, wherein the first and second lead frames each have at least one third blind hole formed concavely on the respective stepped structure.

10. The metallic frame structure of claim 9, wherein the metallic frame has at least one bar protruding therefrom, and wherein two sides of the bar are substantially in position corresponding to two neighbor third blind holes.

11. The metallic frame structure of claim 1, wherein the first and second lead frames each defines an upper groove formed concavely on the edge of the upper surface thereof proximate to the electrically insulated region, the first and second lead frames each defines a lower groove formed concavely on the edge of the lower surface thereof proximate to the electrically insulated region, and the upper and lower grooves cooperatively define a multi-segmented structure.

12. The metallic frame structure of claim 11, wherein the uppers grooves defined by the first and second lead frames are separated by a corresponding distance greater than that of the insulated region, and the lower grooves defined by the first and second lead frames are separated by a corresponding distance greater than that between the upper grooves.

13. The metallic frame structure of claim 11, wherein the upper grooves have an arc-shaped cross-section and the lower grooves have a straight-edged cross-section.

14. The metallic frame structure of claim 1, wherein at least one through hole having an upper hole portion and a lower hole portion respectively exposed on an upper surface and a bottom surface of the first lead frame is penetrated through the metallic frame, and the lower hole portion is defined by a diameter greater than that of the upper hole portion.

15. The metallic frame structure of claim 1, wherein the second lead frame has a multi-sided portion facing the protruding portion of the first lead frame.

16. An LED device, comprising:
a metallic frame defining a chip-mounting area and including a first lead frame and a second lead frame;
at least one LED chip disposed on the chip-mounting area of the metallic frame and connected electrically to the first and second lead frames; and
a packaging body having a base portion for encapsulating the metallic frame and a light-permitting portion arranged above the LED chip;
wherein the first lead frame has a protruding portion extending toward the second lead frame, and an electrically insulated region is defined between the first and second lead frames;
wherein at least one first blind hole and at least one second blind hole are selectively formed on at least one of the first lead frame and the second lead frame, the first blind hole is formed concavely on an upper surface of the metallic frame and located substantially adjacent to a circumference of the light-permitting portion, and the second blind hole is formed in proximate to the electrically insulated region;
wherein the at least one first blind hole is distributed around the chip-mounting area that the at least one LED chip is mounted thereon, and the at least one second blind hole is communicated with the electrically insulated region.

17. The LED device of claim 16, wherein the base portion encapsulates the first and second lead frames, and has a receiving space formed above the first and second lead frames for receiving the LED chip therein and an annular light-reflecting surface surrounded the receiving space for reflecting light emitted by the LED chip.

18. The LED device of claim 17, wherein the base portion further includes a rib made of a light-reflecting material penetrating the electrically insulated region and protruding from the upper surface of the metallic frame.

19. The LED device of claim 18, wherein the base portion and the light-permitting portion are formed in one piece, and the packaging body directly encapsulates the first and second lead frames.

20. The LED device of claim 16, wherein the first and second lead frames are encapsulated by a non-light transmitting base portion of the packaging body, and the non-light transmitting base portion is flush with an upper and a lower surfaces of the metallic frame.

* * * * *